United States Patent [19]

Ormond

[11] 4,107,618
[45] Aug. 15, 1978

[54] AMPLIFIER SYSTEM HAVING SIGNAL GAIN INDEPENDENT OF A REFERENCE VOLTAGE

[76] Inventor: Alfred Newman Ormond, 11969 E. Rivera Rd., Santa Fe Springs, Calif. 90670

[21] Appl. No.: 821,632

[22] Filed: Aug. 4, 1977

[51] Int. Cl.² .......................... H03F 3/45; H03F 3/68
[52] U.S. Cl. ...................................... 330/51; 330/69; 330/84; 330/108; 330/124 R
[58] Field of Search ..................... 330/51, 69, 84, 108, 330/124 R, 254, 278, 295

[56] References Cited

U.S. PATENT DOCUMENTS

| 3,039,062 | 6/1962 | Nessel | 330/84 |
| 4,047,122 | 9/1977 | Rao | 330/84 |

*Primary Examiner*—James B. Mullins
*Attorney, Agent, or Firm*—Ralph B. Pastoriza

[57] ABSTRACT

The amplifier system comprises a pair of operational amplifiers with an appropriate resistance network such that when a reference voltage and differential signal are applied to the system, changes in the gain of the amplifier system will only change the gain of the differential signal and will not affect the reference voltage.

3 Claims, 3 Drawing Figures under 4,107,618

AMPLIFIER SYSTEM HAVING SIGNAL GAIN INDEPENDENT OF A REFERENCE VOLTAGE

This invention relates to electronic circuit components and more particularly to an amplifier system having signal gain independent of a reference voltage.

BACKGROUND OF THE INVENTION

In certain types of instrumentation, such as involved in analog to digital converters, it is desirable to have a reference voltage applied to an amplifier system that does not change in value when the gain of the amplifier is changed. With such an arrangement, a differential signal can be applied to the amplifier and the gain of the amplifier can be adjusted so that only the signal is amplified and the reference voltage is not amplified.

BRIEF DESCRIPTION OF THE PRESENT INVENTION

With the foregoing in mind, the present invention contemplates a specifically designed amplifier system wherein a signal can be amplified without affecting a reference voltage.

Briefly, the system comprises first and second operational amplifiers each having an output and positive and negative inputs with appropriate first and second negative feedback resistances connected respectively between the outputs and negative inputs. The differential signal is applied to the positive input terminals of the amplifiers. A resistance means across which a reference voltage is applied includes a center resistance tapped on either side to the negative terminals of the operational amplifiers to bias these negative inputs to plus and minus values of the reference voltage. The gain of the amplifier system is adjusted by adjusting the value of the center resistance with the result that the output signal can be amplified without affecting the output reference voltage.

BRIEF DESCRIPTION OF THE DRAWINGS

A better understanding of this invention will be had by now referring to the accompanying drawings in which.

DETAILED DESCRIPTION OF THE INVENTION

Figure 1:
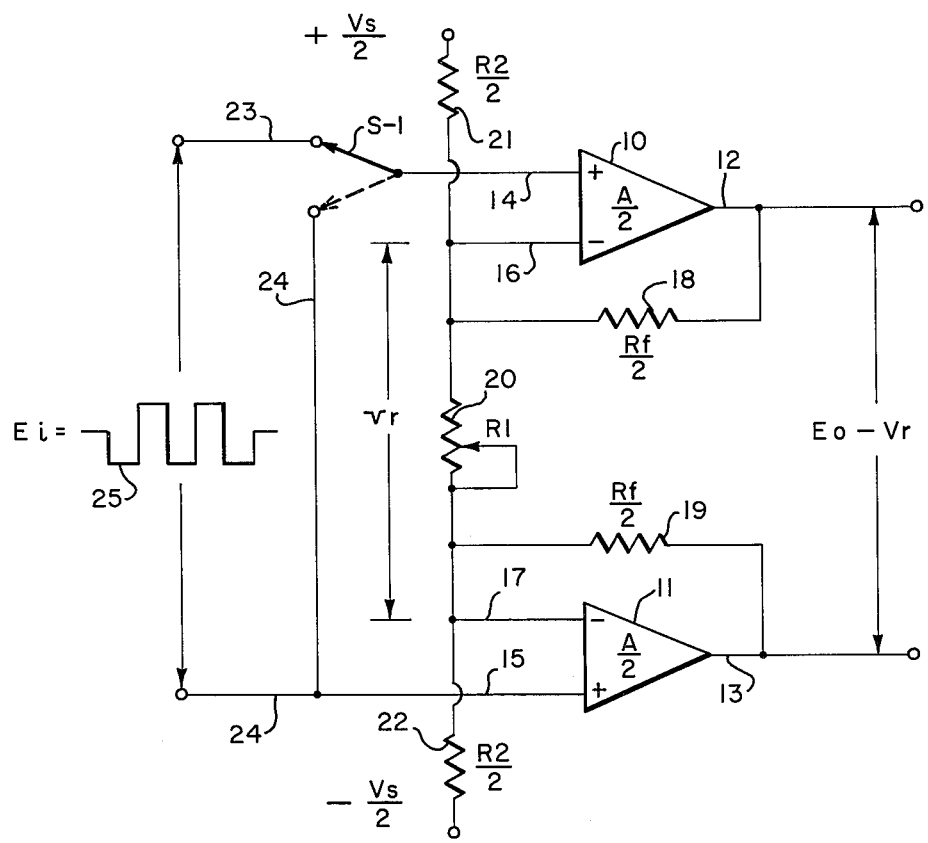
FIG. 1 is a circuit diagram of the amplifier system of this invention.

Referring first to FIG. 1, the amplifier system includes first and second operational amplifiers 10 and 11 each having an output 12 and 13 respectively and positive and negative inputs 14, 15 and 16, 17 respectively.

First and second negative feedback fixed value resistances 18 and 19 connect respectively between the outputs 12 and 13 and the negative inputs 16 and 17 as shown.

The circuit is completed by the provision of resistance means across which a reference voltage Vs is applied. These resistance means includes a center resistor 20 with taps on either side connecting to the negative input leads 16 and 17 of the operational amplifiers. Also included are outer fixed value resistances 21 and 22 connected to the taps leading to the inputs 16 and 17 of the amplifiers as shown. The negative inputs of the amplifiers are thus biased between plus and minus values of the reference voltage Vs. The center resistance 20 is variable as indicated by the arrow tap and controls the gain of the amplifier system.

A differential input signal 25 shown to the left of FIG. 1 and designated as E$i$ is applied to the positive terminals 14 and 15 of the operational amplifiers by way of input leads 23 and 24 respectively. In the particular circuit depicted in FIG. 1 there is also shown a switch S-1 in the input lead 23 for purposes of shunting the input positive terminals of the operational amplifiers for reasons as will become clearer as the description proceeds.

For convenience in describing the operation of the circuit of FIG. 1, the feedback resistances 18 and 19 are shown as equal to one half a resistance designated R$f$ while the variable center resistance 20 is designated R1 and the two outer resistances which are equal are designated each as one half a resistance value R2. The plus and minus biasing of the negative input terminals of the amplifiers are accomplished by a plus reference voltage V$s$/2 at the top of the resistance means and a −V$s$/2 at the bottom of the resistance means. The voltage drop across the center resistance R1 is designated $vr$ and the output signal between the outputs 12 and 13 of the operational amplifiers constitutes the sum of the output signal E$o$ and a reference voltage V$r$. The overall amplification or gain of the amplifier system is designated by the letter A, each operational amplifier 10 and 11 providing an amplification of A/2.

From the interconnections of the various resistances in the circuit of FIG. 1, the following relationship is immediately apparent:

$$A = \frac{Rf}{\frac{R1R2}{R1+R2}} = \frac{Rf}{R2} \cdot \frac{1}{\frac{R1}{R1+R2}} \tag{1}$$

That is, the gain or amplification equals the ratio of the sum of the two feedback resistances to the equivalent resistance of R1 and R2 in parallel.

In addition, the ratio of the voltage drop V$r$ across R1 to the reference voltage V$s$ across R1 and the two resistances 21 and 22 each having a value R2/2, is given by:

$$\frac{vr}{Vs} = \frac{R1}{R1+R2} \text{ or } \frac{Vs}{vr} = \frac{1}{\frac{R1}{R1+R2}} \tag{2}$$

Substituting V$s$/$vr$ for $$\frac{1}{\frac{R1}{R1+R2}}$$

in Equation (1) yields:

$$A = \frac{Rf}{R2} \cdot \frac{Vs}{vr} \tag{3}$$

Since V$r$ = A$vr$ substituting the value for A in Equation (3) yields:

$$Vr = Vs \frac{Rf}{R2} \tag{4}$$

From Equation (4), it is thus evident that the amplified reference $Vr$ is proportional to the ratio of the feedback resistance $Rf$ divided by the reference resistance $R2$, times the applied reference voltage $Vs$, all of which are of fixed values and thus independent of the gain $A$ of the amplifier system.

Figure 2:
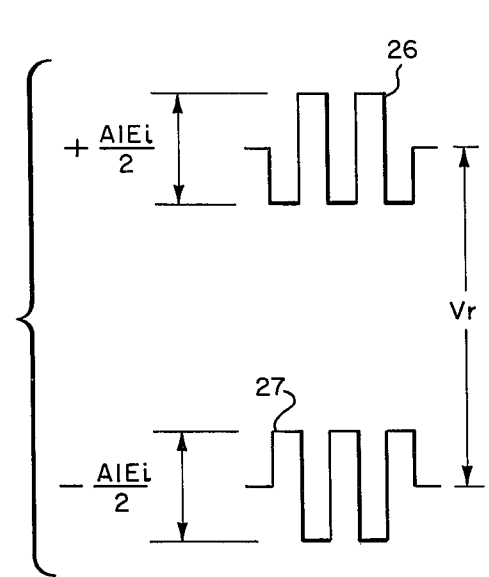
FIG. 2 illustrates output signals resulting from a first setting of the gain of the amplifier system; and, FIG. 3 illustrates output signals resulting from a second setting of the gain of the amplifier system.

Referring to FIG. 2, there is shown the output of the amplifier system for an input differential signal $Ei$ depicted at 25 in FIG. 1 for a given gain $A1$ for the amplifier system as set by the resistance $R1$. Before the input signal is applied, the output is a differential voltage $Vr$, half of which comes from each side of the operational amplifiers. These are constant values. When the input signal $Ei$ is applied, the signal adds or subtracts from the amplified reference voltage $Vr$ and appears as two independent signals 26 and 27 out of phase with each other.

Figure 3:
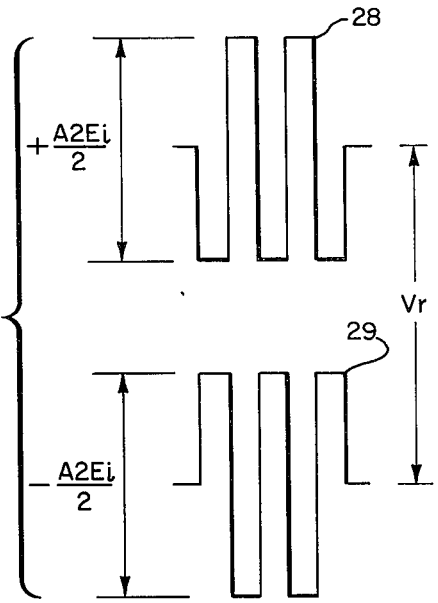

When the gain of the amplifier system is changed by adjusting the resistance $R1$ to an increased gain; for example, $A2$, the gain associated with the amplifier input signal $Ei$ is changed; that is, the output signal is increased as illustrated by the two amplified signals 28 and 29 again out of phase with each other, the same riding the reference voltage $Vr$ signals. It will be noted, however, that the reference voltage $Vr$ is unchanged from the condition of FIG. 2 to the condition of FIG. 3 wherein the gain of the amplifier system has been increased to increase the amplification of the input signal.

If $R1$ is set to a constant value, it will be evident from previous Equations (2) and (4) that:

$$A = \frac{Vr}{vr} = \frac{Vr}{Vs} \cdot \frac{1}{\frac{R1}{R1+R2}} \quad (5)$$

Further, $$A = \frac{Eo}{Ei} \quad (6)$$

From the foregoing two Equations $$Ei = \frac{Eo}{Vr} \cdot Vs \left(\frac{R1}{R1+R2}\right) \quad (7)$$

Thus, $Ei$ is defined by measuring the ratio of the output voltages ($Eo/Vr$) times the voltage constant $Vs$ and the resistance ratio ($R1/R1+R2$) which, for amplifiers having open loop gains in excess of 20,000, is independent of the amplifier gain characteristics.

The value for $Vr$ is determined by measuring this voltage when the input terminals to the operational amplifiers 23 and 24 of FIG. 1 are shorted together. This shorting can be accomplished by providing a shunting switch S-1 as shown in the first input lead 23 in FIG. 1 which, when thrown to the dotted line position simply shunts the first and second input terminals.

From all of the foregoing, it will thus be evident that the foregoing invention has provided an amplifier system wherein it is possible to vary the gain of an input signal without affecting a desired reference voltage.

I claim:

1. Am amplifier system to which a reference voltage and differential input signal are applied and wherein the gain of said amplifier system can be varied to vary the amplification of said differential input signal without affecting said reference voltage, including, in combination:

(a) first and second operational amplifiers having outputs and positive input terminals and negative input terminals;

(b) first and second negative feedback fixed value resistances connected directly between the outputs and negative input terminals of said operational amplifiers respectively; and (c) resistance means across which said reference voltage is applied, said resistance means including a center resistance with tap points on either side connecting to the negative input terminals to bias the negative input terminals of said operational amplifiers respectively between plus and minus values of said reference voltage and two outer fixed value resistances connected to opposite ends of said center resistance respectively, said differential input signal being supplied to the positive input terminals of said amplifiers, the gain of said amplifier system being adjusted by adjusting the value of said center resistance, the gain in each operational amplifier always being equal to the gain in the other and varying simultaneously therewith in the same direction.

2. A system according to claim 1, in which said first and second negative feedback fixed value resistances each have a value $Rf/2$, said center resistance having a value $R1$ for a given gain setting of $A$ and said outer resistances each having a value of $R2/2$ and wherein said reference voltage applied across said resistance means is $Vs$ and the reference voltage at the output terminals in the absence of any given input signal is $Vr$, said reference voltage $Vr$ at the output terminals being defined by:

$Vr = Vs\, Rf/R2$ whereby said reference voltage $Vr$ is independent of changes in the gain $A$ of said amplifier system resulting from changing the value of $R1$.

3. The system of claim 2, including first and second input leads connected to said positive input terminals of said first and second operationsl amplifiers respectively, said first input lead having switch means for shunting said first terminal to said second terminal, said reference voltage at said output terminals being measured when said switch means is in said shunting position.

* * * * *